United States Patent [19]

Zappella et al.

[11] Patent Number: 5,440,239

[45] Date of Patent: Aug. 8, 1995

[54] TRANSFERABLE SOLDER BUMPS FOR INTERCONNECT AND ASSEMBLY OF MCM SUBSTRATES

[75] Inventors: Pierino I. Zappella, Garden Grove; William R. Fewer, Diamond Bar, both of Calif.

[73] Assignee: Rockwell International Corporation, Seal Beach, Calif.

[21] Appl. No.: 232,969

[22] Filed: Apr. 25, 1994

[51] Int. Cl.$^6$ .................. G01R 1/04; C25D 5/02; H01C 23/48; H01C 29/44

[52] U.S. Cl. .................... 324/757; 205/123; 257/419

[58] Field of Search ............... 324/754–759, 324/72.5; 428/323, 209; 357/68–79, 80; 205/123

[56] References Cited

U.S. PATENT DOCUMENTS 5,189,505  2/1993  Bartelink .................. 257/419
5,217,597  6/1993  Moore et al. .............. 205/123

OTHER PUBLICATIONS

Ron Iscoff, "Wire Bonders—Stretched to the Max?", Semiconductor International, Feb. 1993.
Linda Becker (News & Events), "Flip Chip Eliminates Package" Interconnection Technology, Sep. 1993 edition, p. 9.
Howard W. Markstein, "Multichip Modules Pursue Wafer Scale Performance," Electronic Packaging & Production, Oct. 1991, pp. 40–45.
Rodney Myrvaagnes, "Which comes first, known-good die or multichip modules?" Electronic Products (Outlook), Nov. 1992, p. 16.
BPA Technology & Management, Ltd., System 2000 "Flip Chip", Advanced Assembly-Technology, Jul. 1993, pp. 52–54.
Ron Iscoff, (Assembly & Packaging News), "Convention Wire Bonders Reaching Technological Limits," Semiconductor International, p. 68. Feb. 1993.

*Primary Examiner*—Kenneth A. Wieder
*Assistant Examiner*—Barry C. Bowser
*Attorney, Agent, or Firm*—H. Fredrick Hamann; George A. Montanye; Tom Streeter

[57] ABSTRACT

The invention uses transferable solder bump connection techniques in combination with a disposable test board to test and burn-in "as received" (i.e., untested) dies. Using transferable solder bumps, a die is first attached to the top of a disposable test board. The test board can be designed to allow 100% functional testing of the die as well as burn-in. Dies that successfully complete the test and burn-in process are considered to be "known good dies." Next, heat is applied to remove the known good die from the test board. A property of the invention is that solder bumps transfer with the die such that it can be used immediately in a flip-chip configuration and affixed to a MCM or other circuit board.

20 Claims, 7 Drawing Sheets

TRANSFERABLE SOLDER BUMPS FOR INTERCONNECT AND ASSEMBLY OF MCM SUBSTRATES

BACKGROUND OF THE INVENTION

The invention relates to a novel solder bump flip-chip interconnect scheme. More specifically, the invention involves a process wherein transferable solder bumps are used to attach a semiconductor die to a disposable test device; after testing, and without further processing of the die's aluminum bonding pads, the solder bumps are transferred to the semiconductor die using a reflow operation, thereby making the die ready for mounting in a multichip module package.

Overview of Some Prior Circuit Connection Techniques

FIG. 1 shows one prior art technique for attaching an integrated circuit (ICs) package 100 to a circuit board 105. In this particular case, the IC 110 itself is inside a plastic dual in-line package 100 having bent metal leads 115. (For convenience, an individual IC 110 is often referred to as a "die".) Wire leads 120 are used to connect the IC 110 to the package's bent leads 115. To mount the package, the leads 115 are inserted into matching holes 125 in the circuit board 105 and fixed in place by, e.g., solder.

FIG. 2 shows another prior art technique of attaching an IC to a circuit board generally known as the "solder-bump" approach. In this technique, the die 110 has metal pads on which small bumps of solder 200 are deposited. The die 110 is aligned over matching metal pads 205 on the circuit board 210. When the assembly is heated to above the solder's 200 melting point, the solder melts to form an electrical contact between the IC 110 and the circuit board 210. In this configuration, the die 110 is upside down from what is shown in FIG. 1. Thus, this configuration is also known as a "flip-chip" arrangement. A useful general background discussion of the flip-chip concept can be found in the article *Flip Chip Eliminates Package*, Interconnection Technology, September 1993, page 9. Additional background information can be found in the article *Flip Chip*, Advanced Assembly Technology, BPN Technology & Management Ltd., pages 52–54.

Multichip Module Technology

Closely related to die connection technology is the increasing use of multichip module (MCM) design and packaging. In short, MCM techniques seek to combine a number of different dies on a common substrate. Benefits of MCM systems include increased operating clock speeds and reduced product footprint. A useful general background discussion of multichip module concepts and related bonding techniques can be found in the article *Multichip Modules Pursue Wafer Scale Performance*, Electronic Packaging & Production, October 1991, pages 40–45.

Some in the semiconductor industry predict that as "real estate," i.e., surface area, on integrated circuits continue to shrink, flip-chip bonding techniques will become dominant. See, e.g., *Assembly & Packaging News*, Semiconductor International, page 68. Some of the benefits of the flip-chip bonding technique over wire bonding or tape automated bonding techniques—two other common die connection methods—are summarized in Table 1. Tape automated bonding is presently a preferred method of bonding dies to MCM-like substrates (*Multichip Modules Pursue Wafer Scale Performance*, Electronic Packaging & Production, October 1991, page 42.)

TABLE 1

| Comparison of Typical Die Connection Characteristics | | | |
|---|---|---|---|
| | Flip-Chip | Wire Bonding | Tape Automated Bonding |
| Resistance (Ohms) smaller is better | 0.002 | 0.030–0.035 | 0.020 |
| Inductance (nH) smaller is better | 0.200 | 0.65 | 2.10 |
| Capacitance (pF) smaller is better | 0.001 | 0.006 | 0.040 |
| Example Bond Size, one side (mils) smaller is better | 400 | 472 | 520 |

As shown in Table 1, the flip-chip technique requires less bonding area (for a given size die, e.g., 400 mils on a side) than does either wire or tape automated bonding methods. This, in turn, allows for an increased packing density of dies on a MCM's substrate. Flip-chip bonding also provides lower levels of resistance, capacitance, and inductance per contact than do these other methods. All these features support increased operational speeds.

The Known Good Die Problem

A significant problem in assembling MCM systems, or other multi-die circuits, is that dies purchased from silicon foundries usually cannot be assumed to be 100% good. In a large multi-die circuit, the probability that a completed circuit will contain all good dies decreases exponentially as the number of dies increases. A significant problem for companies that assemble dies into circuits, e.g., system houses, is that of testing purchased dies to insure that they are in fact good/functional.

From the system house's point of view, the problem is being able to obtain dies that are known good so that the system house does not have to incur the cost of testing each purchased die. Silicon foundries, on the other hand, make their money in running wafers and often do not want to perform costly functional testing. Many silicon foundries might be willing to perform, at most, a worst-case DC test at the wafer level.

If a system house decides to forgo die testing in manufacturing e.g., a 100 die MCM, and any one or more of the dies are bad, the system house incurs the added costs of fault isolation and die removal and replacement—a possibly time-consuming and costly endeavor. Because of the costs of these operations, it has been reported that "[a]ll of the forward-thinking semiconductor companies are now developing capabilities to perform bare die testing in preparation for flip chip" (*Multichip Modules Pursue Wafer Scale Performance*, Electronic Packaging & Production, October 1991, page 443).

In short, a long-felt need exists for an efficient testing mechanism which can easily and readily feed a MCM-like manufacturing process.

SUMMARY OF THE INVENTION

The invention uses a transferable solder bump connection technique in combination with a disposable test device to test and burn-in "as received" (i.e., untested) semiconductor dies. Using transferable solder bumps, a die is first attached to the top of a disposable test device (whose substrate could consist of standard materials such as alumina, epoxy, phenolic, "KAPTON", polyimide, TAB tape, and the like) to form a test module. The test module can be designed to allow 100% functional testing of the die as well as burn-in. Dies that successfully complete the test and burn-in process are considered to be "known good dies." Next, heat is applied to remove the known good die, and its associated transferable solder bumps, from the test device which can then be used immediately in a flip-chip configuration and affixed to a MCM or other circuit board.

DETAILED DESCRIPTION OF SPECIFIC EMBODIMENTS

One illustrative embodiment of the invention is described below as it might be implemented using transferable solder bump techniques. In the interest of clarity, not all features of an actual implementation are described in this specification. It will of course be appreciated that in the development of any such actual implementation, numerous implementation-specific decisions must be made to achieve the developers' specific goals and subgoals, such as compliance with system- and business-related constraints, which will vary from one implementation to another. Moreover, it will be appreciated that such a development effort might be complex and time-consuming, but would nevertheless be a routine undertaking of device engineering for those of ordinary skill having the benefit of this disclosure.

Overview of Test Assembly

Figure 1:
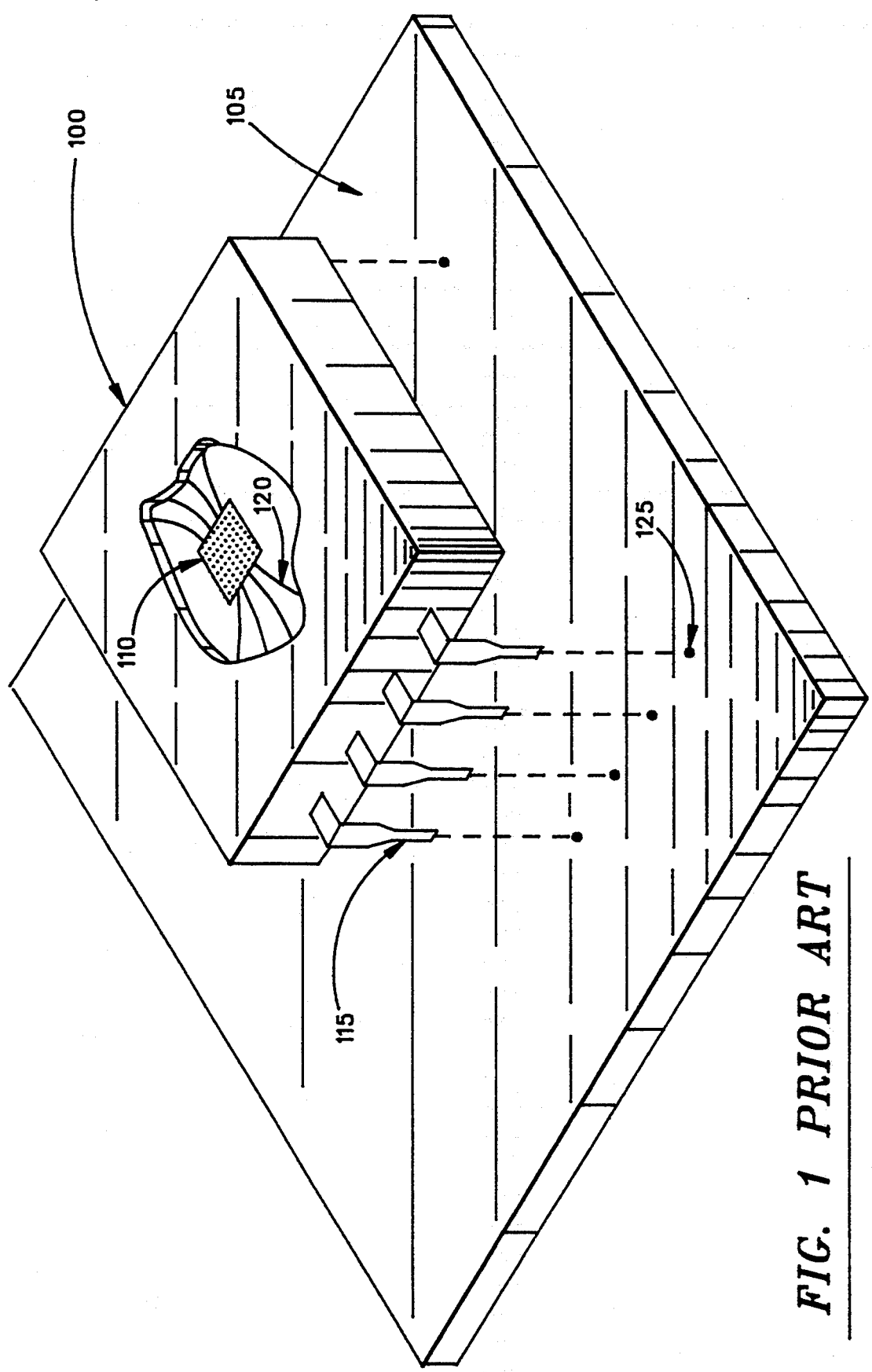
FIG. 1 is an illustrative diagram of how a dual in-line package is typically attached to a circuit board.
Figure 2:
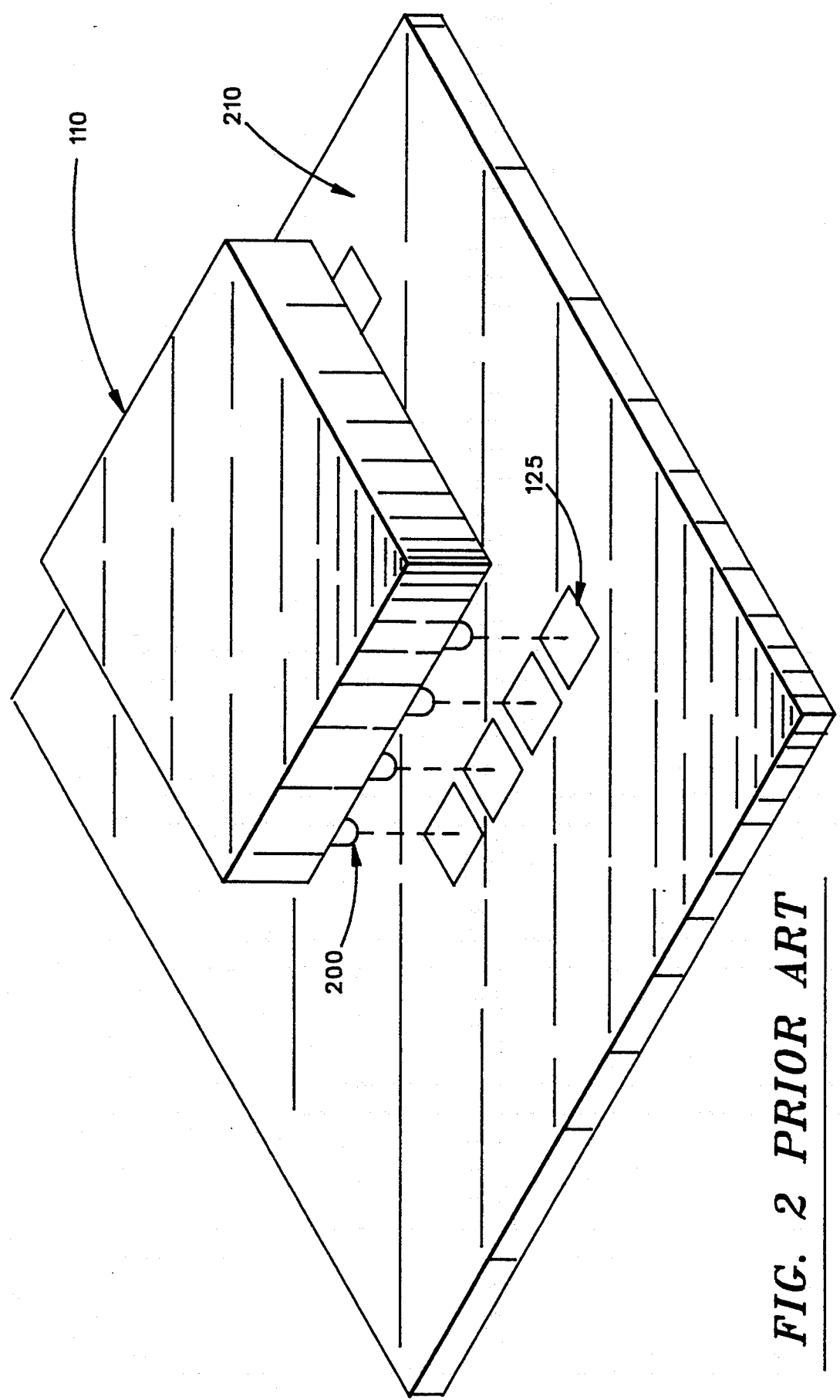
FIG. 2 is an illustrative diagram showing how the flip-chip solder bump technique can be used to attach a semiconductor die to a circuit board.
Figure 3:
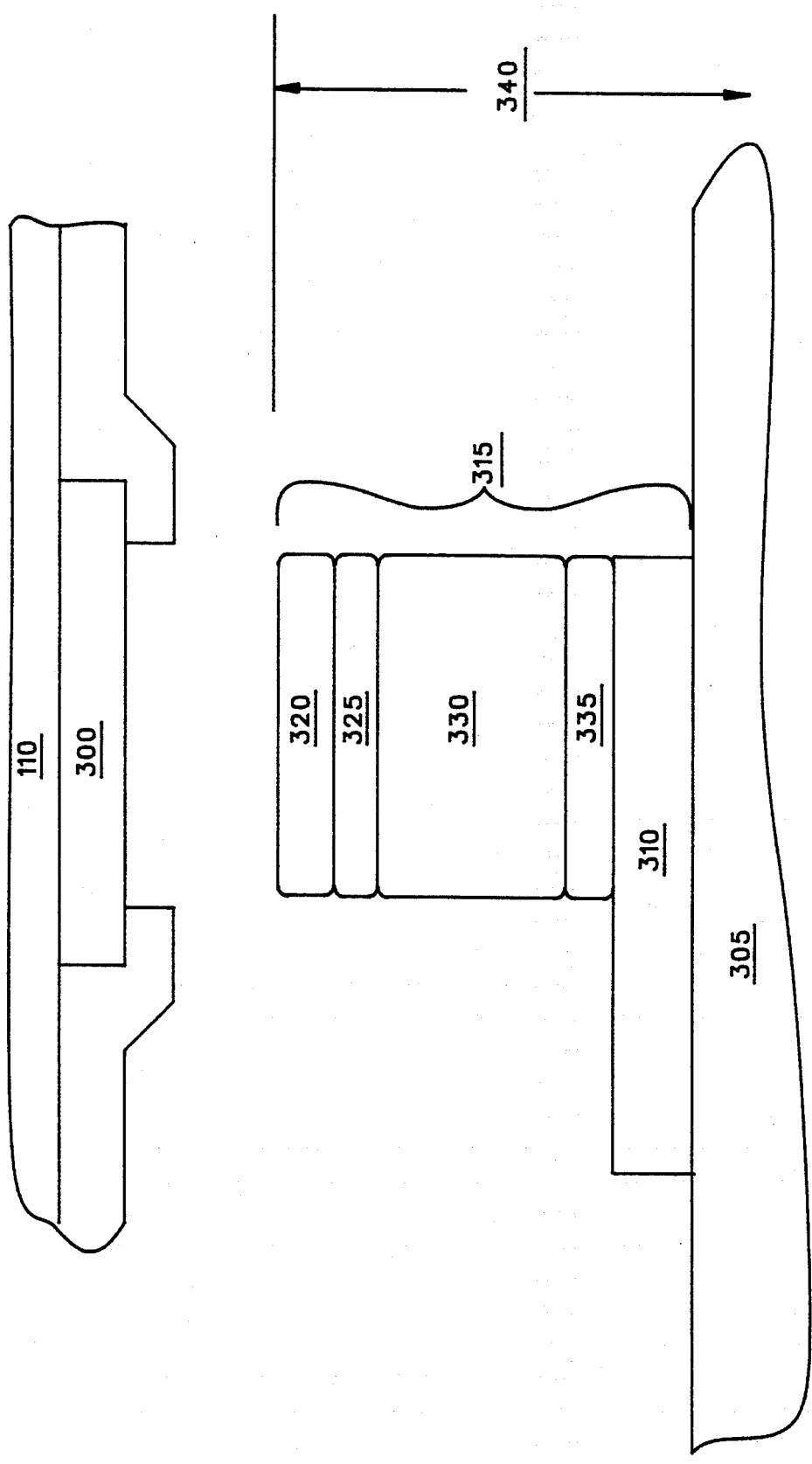
FIG. 3 shows a test assembly in accordance with the invention as it appears just prior to bonding a semiconductor die to a test board.

FIG. 3 shows an illustrative test assembly in accordance with the invention as it might appear just prior to bonding a test device 340 to a die 110. The IC or die 110 is shown as having an aluminum pad 300 through which electrical connections can be made. The test board 305 includes an electrical contact pad, such as an aluminum pad 310, and a transferable solder bump (TSB) stack 315. In one embodiment, the test board 305 is a disposable carrier through which electrical connections to an automated test device can be made. The TSB stack 315, in this implementation, is made up of a number of metalization layers:

1. A top layer of gold 320 that eventually forms a permanent contact with the die's aluminum pad 300.
2. A diffusion barrier layer 325 which can be, for instance, comprised of copper or nickel/copper.
3. A solder bump layer 330 comprised of a reflowable solder alloy. (In this context, a reflowable solder is any electrically deposited or other type of conductive material that can be melted and resolidified.) The solder bump layer 330 could be, for instance, comprised of pure tin, lead/tin, an indium solder alloy, or various other alloys depending on the target melting point needed for the final package assembly, e.g., MCM.
4. A protected conductor layer 335, such as a chrome layer, deposited in a vacuum so that it does not form an oxide layer. In one embodiment, the protected conductor layer 335 is comprised of chromium. Underneath this layer, and not shown in FIG. 3, is a metalization layer of either aluminum, copper or gold which allows a connection between the TSB stack 315 and the test board's electrical contact pad 310.

An important aspect of the protected conductor layer 335 is that upon reflow, and when exposed to air, it separates so that the solder bump layers 320, 325, and 330 are permanently transferred off the test board 305 while the gold layer 320 remains bonded to the die's aluminum pad 300.

For the TSB process to be successful, the protected conductor layer 335 to solder bump layer 330 interface and the gold layer 320 to the die's aluminum pad layer 300 interface should have the following characteristics.

1. The interface between the protected conductor layer 335 and the solder bump layer 330 should be conductive. That is, the protected conductor-solder bump interface should not present a high resistance path for current between the test board 305 and the die substrate 110. It is also important that the solder bump layer 330 separates, or de-wets, from the protected conductor layer 335 during reflow operations.
2. The interface between the gold layer 320 and the die's aluminum pad layer 300 should be bondable to the die, e.g., by a gang bonding process. It is also important that the gold-aluminum interface stays bonded during subsequent reflow operations or other bonding processes such as single-point TAB bonding.

Attachment of Die to Test Board and Testing

Preparatory to attaching the test device 340, with its possibly hundreds to thousands of TSB stacks 315, to the die 110 (depending upon the number of metalization pad sites 300 present on the target die) the two are aligned directly over one another as shown in FIG. 3.

Figure 4:
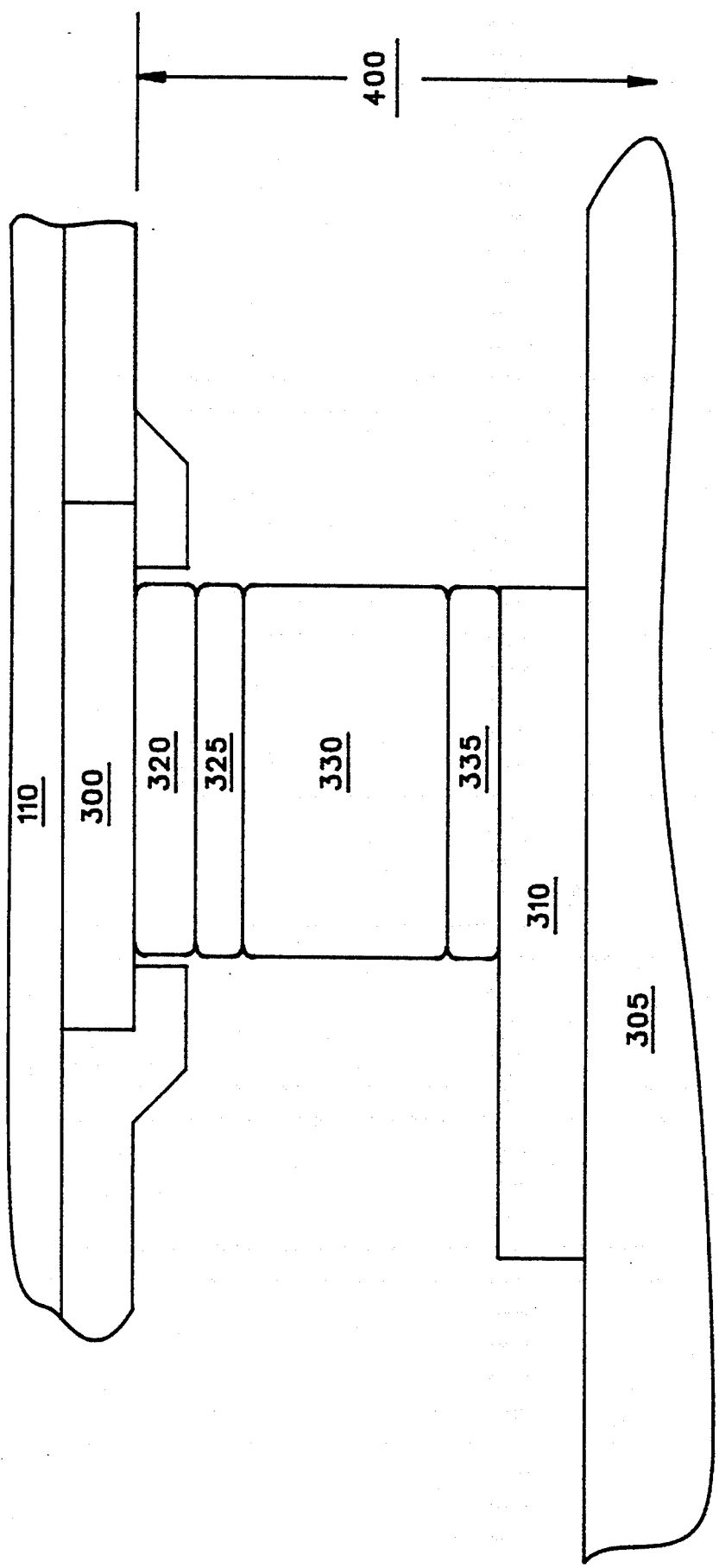
FIG. 4 shows a semiconductor die bonded to a test device in accordance with the invention.

FIG. 4 shows a test module 400—the combination of test device 340 and die 110—in accordance with the invention. Bonding of the test device and die is generally accomplished through either thermal compression or thermalsonic techniques. As the name implies, thermal compression bonding uses compression and heat to form a bond between the gold layer 320 and the die's aluminum pad 300. Thermalsonic bonding techniques use compression, heat, and ultrasonic energy to introduce a scrubbing action between the gold layer 320 and the die's aluminum pad 300.

Once the die 110 and test device 305 are bonded, the test module 400 can be plugged into a test jig for complete, at-speed, functional testing. Once functional testing is completed, the same test module can be placed in an oven for burn-in testing to verify long term reliability.

Detachment of Die and TSB from Test Board

Figure 5:
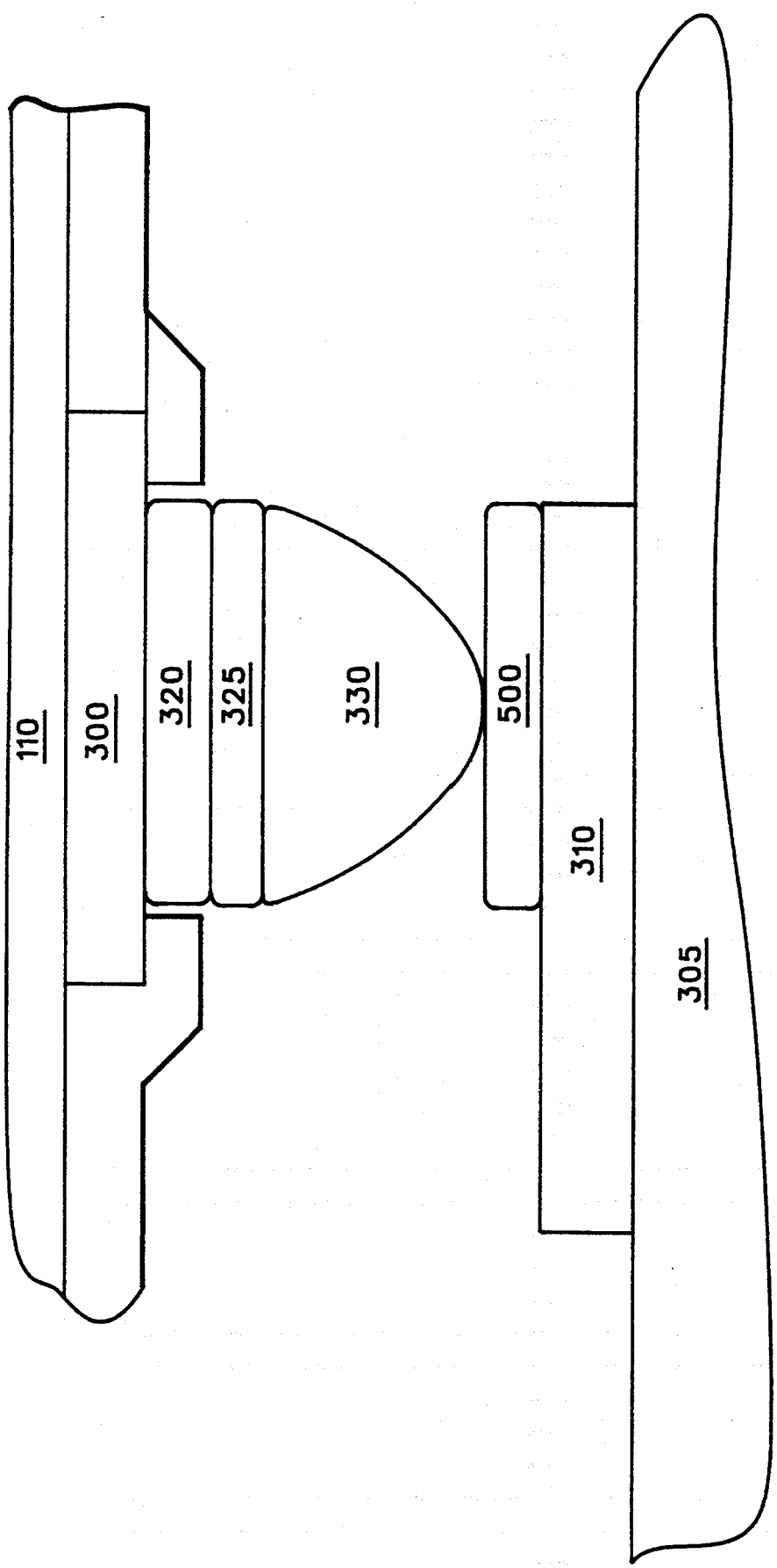
FIG. 5 shows a semiconductor die with a newly bonded solder bump as it is about to be detached from a test device in accordance with the invention.

As a consequence of functional- and burn-in testing, if the die 110 is determined to be defective or have a reliability problem the entire test module can be discarded. If, on the other hand, the die passes these tests it can be incorporated as a known good die in a, for example, MCM assembly. To do this the die and its associated TSBs need to be removed from the test device. FIG. 5 shows a die 110 with a solder bump as it is about to be detached from the test board 305. In this illustrative embodiment, the TSB's protected conductor layer is comprised of chrome 500.

During functional and burn-in testing only the sides of the chrome that are exposed to air, resulting in a slight chromium oxide build-up. Upon elevating the air temperature the solder will begin to separate from the chromium oxide on the sides of the stack. As the solder begins to ball up, more and more chrome in the middle of the stack is exposed to air and is converted to chromium oxide. The solder pulls itself away from this newly formed chromium oxide, balling up as shown in FIG. 5 until such time that the die with its attached solder bump, can be separated from the test board. The result is a die, with attached solder bumps at all of its metalization pads 300 that is ready for flip-chip bonding to a, for example, MCM assembly.

Figure 6:
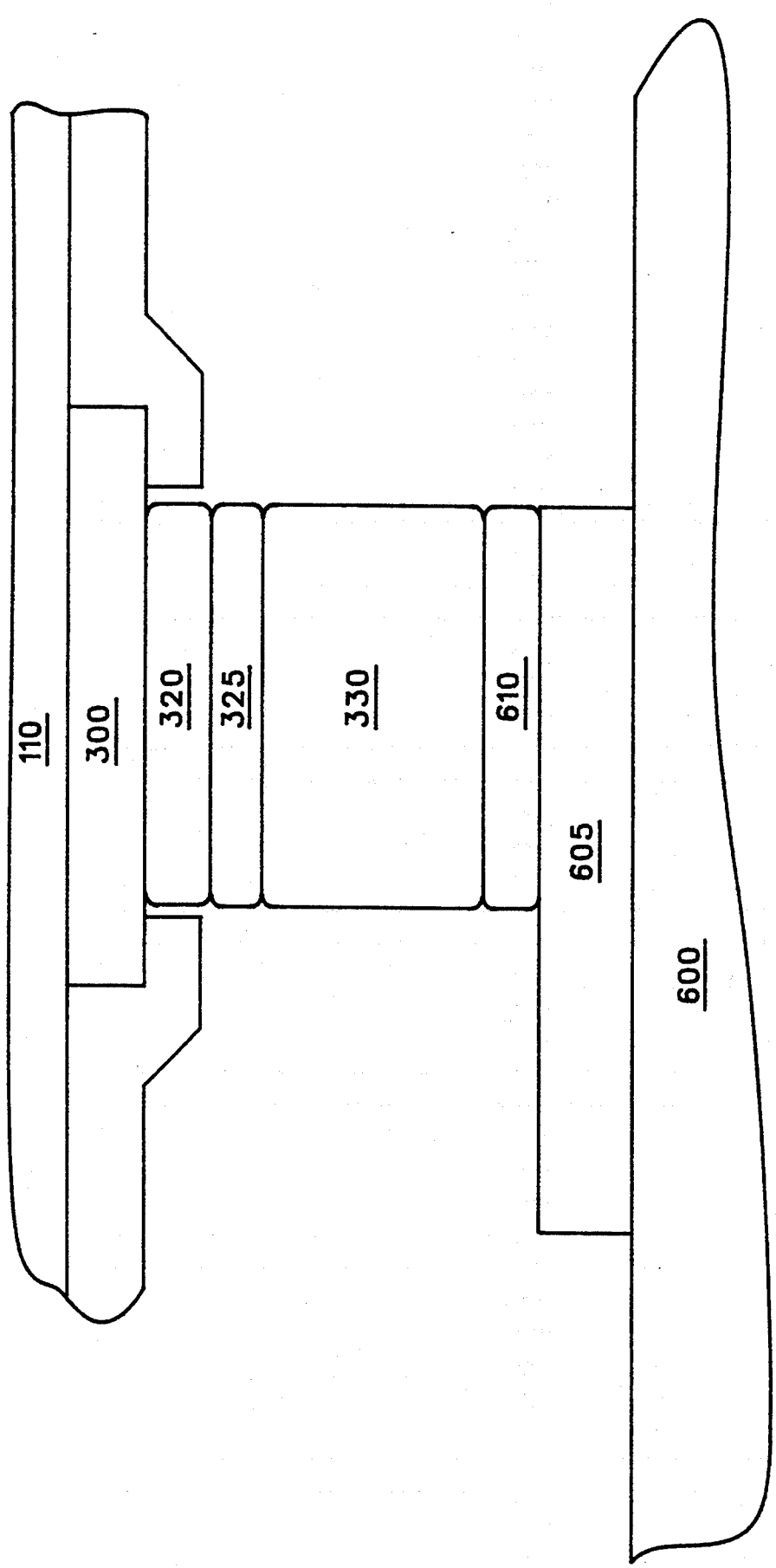
FIG. 6 shows a semiconductor die bonded to a multichip substrate using transferable solder bumps in accordance with the invention

After removing the die with its TSBs from the test board it can be aligned and solder reflow mated onto a, for example, MCM substrate as shown in FIG. 6. In general, MCM substrates 600 have a metalization of aluminum 605 or copper with an additional top barrier layer of gold 610.

Some Benefits of the Invention

The transferable solder bump approach allows full speed testing of "as-received" semiconductor dies from a silicon foundry. The solder bumps used to attach the die to a test board are directly transferable to the die after testing is complete, making the assembly ready for final flip-chip bonding to a MCM substrate or other circuit board. No additional processing of the foundry dies is necessary. Additionally, use of the transferable solder bump process to fabricate MCM assemblies is faster and less expensive than tape automated bonding techniques, the currently dominant method of bonding.

Some Possible Uses

Figure 7:
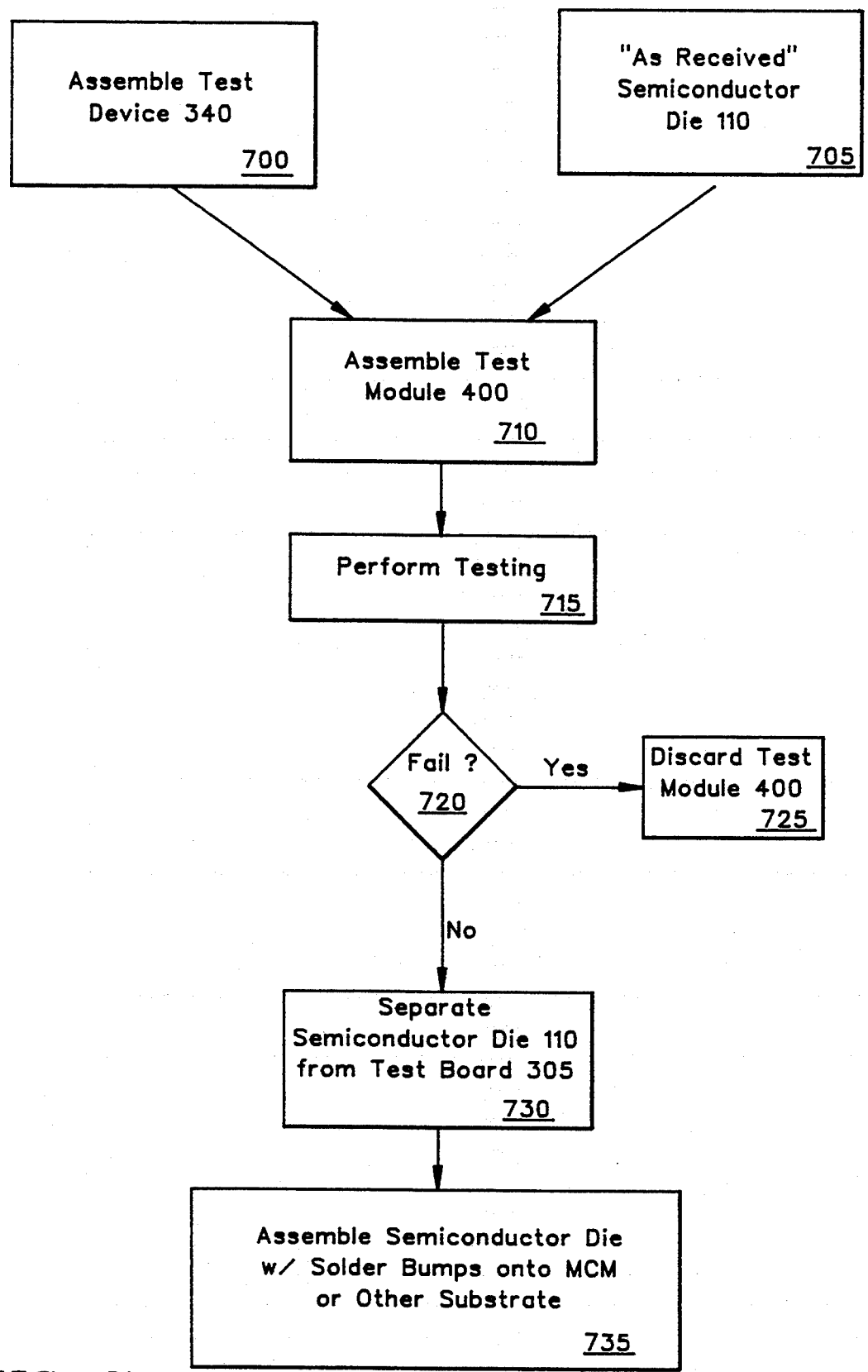

The use of transferable solder bump technology, in accordance with the invention, is illustrated in an exemplar integrated testing and manufacturing process outlined in FIG. 7. A test device 340, comprising a test board and a transferable solder bump stack, is assembled at block 700. The test device is combined with an "as received" semiconductor die 110 at block 705 to form a test module 400 at block 710. The test module is then subjected to one or more specified tests at block 715. Examples of possible tests include at-speed functional and burn-in tests. If the semiconductor die 110 does not pass the tests specified at block 715, the entire test module 400 is discarded at block 725. If the semiconductor die 110 successfully passes the tests specified at block 715, the semiconductor die and its associated transferable solder bumps are removed from the test device's test board 105 at block 730. At this point the semiconductor die 110 is a known good die and is ready for flip-chip bonding to a MCM or other circuit substrate at block 735.

It will be apparent to those of ordinary skill having the benefit of this disclosure that an important feature of the invention described above is that the chromium layer 335 oxidizes in the presence air during solder reflow and prevents subsequent adherence of the transferable solder bump stack 315 to the test board. It is anticipated that other materials with similar oxidation properties will work equally well in appropriate applications, e.g., titanium, aluminum, and other similar conductive elements or compounds. Accordingly, it is the claims set forth below, and not merely the foregoing illustration, which are intended to define the exclusive rights claimed in this application program.

What is claimed is:

1. A semiconductor test device comprising:
   (a) a substrate;
   (b) an interface contact module connected to the substrate wherein the interface contact module comprises
      (1) an electrical contact pad on the substrate;
      (2) a protected conductor surface on said electrical contact pad,
      (3) a reflowable solder module on said protected conductor surface, and
      (4) an electrical contact pad on said reflowable solder module.

2. The semiconductor test device of claim 1 wherein said electrical contact pad on the substrate comprises an aluminum metalization pad.

3. The semiconductor test device of claim 1 wherein said reflowable solder module comprises a solder stack which further comprises:
   (a) a reflowable solder;
   (b) a diffusion barrier layer on said reflowable solder; and
   (c) a semiconductor metalization contact on said barrier layer.

4. The semiconductor test device of claim 3 wherein said diffusion barrier layer comprises copper or a nickel/copper alloy.

5. A process of assembling a semiconductor test device comprising the steps of:
   (a) disposing an electrical contact pad on a test device substrate;
   (b) disposing, on said test device substrate's electrical contact pad, a transferable solder bump module, said transferable solder bump module comprising,
      (1) a protected conductor surface,
      (2) a reflowable solder surface, and
      (3) an electrical contact pad.

6. The process of claim 5 wherein said test device substrate's electrical contact pad comprises an aluminum metalization pad.

7. The process of claim 5 wherein said reflowable solder module further comprises a diffusion barrier surface disposed between said reflowable solder surface and said electrical contact pad.

8. The process of claim 7 wherein said diffusion barrier layer comprises copper or a nickel/copper alloy.

9. A semiconductor test module comprising:
   (a) a semiconductor test device in accordance with claim 1 and
   (b) a semiconductor die mated to said semiconductor test device.

10. A process of assembling a semiconductor test module comprising the steps of:
    (a) constructing a test device in accordance with claim 1 a semiconductor die having metalization pads, such that the semiconductor die's metalization pads are directly above the test device's reflowable solder modules; and
    (b) bonding said test device and said semiconductor die.

11. A process of testing a semiconductor die forming part of a semiconductor test module in accordance with claim 9, comprising the steps of:
   (a) attaching said semiconductor test module to the test device; and
   (b) performing a specified test with said test device on said semiconductor die.

12. A process for removing a semiconductor die forming part of a semiconductor test module in accordance with claim 9, comprising the steps of:
   (a) elevating the air temperature surrounding said test module to reflow the solder bonding said semiconductor die to said test module's test board; and
   (b) separating said semiconductor die from said test module's test board.

13. A semiconductor test module comprising:
   (a) a semiconductor test device in accordance with claim 2; and
   (b) a semiconductor die mated to said semiconductor test device.

14. A process of assembling a semiconductor test module comprising the steps of:
   (a) constructing a test device in accordance with claim 2 and a semiconductor die having metalization pads, such that the semiconductor die's metalization pads are directly above the test device's reflowable solder modules; and
   (b) bonding said test device and said semiconductor die.

15. A process of testing a semiconductor die forming part of a semiconductor test module in accordance with claim 13, comprising the steps of:
   (a) attaching said semiconductor test module to the test device; and
   (b) performing a specified test with said test device on said semiconductor die.

16. A process for removing a semiconductor die forming part of a semiconductor test module in accordance with claim 13, comprising the steps of:
   (a) elevating the air temperature surrounding said test module to reflow the solder bonding said semiconductor die to said test module's test board; and
   (b) separating said semiconductor die from said test module's test board.

17. A semiconductor test module comprising:
   (a) a semiconductor test device in accordance with claim 3; and
   (b) a semiconductor die mated to said semiconductor test device.

18. A process of assembling a semiconductor test module comprising the steps of:
   (a) constructing a test device in accordance with claim 3 and a semiconductor die having metalization pads, such that the semiconductor die's metalization pads are directly above the test device's reflowable solder modules; and
   (b) bonding said test device and said semiconductor die.

19. A process of testing a semiconductor die forming part of a semiconductor test module in accordance with claim 17, comprising the steps of:
   (a) attaching said semiconductor test module to the test device; and
   (b) performing a specified test with said test device on said semiconductor die.

20. A process for removing a semiconductor die forming part of a semiconductor test module in accordance with claim 17, comprising the steps of:
   (a) elevating the air temperature surrounding said test module to reflow the solder bonding said semiconductor die to said test module's test board; and
   (b) separating said semiconductor die from said test module's test board.

* * * * *